(12) United States Patent
Pöchmüller

(10) Patent No.: US 6,456,098 B1
(45) Date of Patent: Sep. 24, 2002

(54) METHOD OF TESTING MEMORY CELLS WITH A HYSTERESIS CURVE

(75) Inventor: Peter Pöchmüller, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/722,118

(22) Filed: Nov. 27, 2000

(30) Foreign Application Priority Data

Nov. 26, 1999 (DE) .......................................... 199 57 124

(51) Int. Cl.⁷ ................................................ G01R 21/26
(52) U.S. Cl. .................... 324/719; 324/766; 324/158.1; 324/765; 324/537
(58) Field of Search ................................. 324/766, 765, 324/158.1, 719, 76.11, 769, 537; 365/201

(56) References Cited

U.S. PATENT DOCUMENTS

| 5,337,279 A | * | 8/1994 | Gregory et al. ...... 324/158.1 X |
| 5,831,918 A | * | 11/1998 | Merritt et al. ............... 365/201 |
| 5,905,384 A | * | 5/1999 | Inoue et al. ................. 324/769 |
| 5,920,574 A | * | 7/1999 | Shimada et al. ........ 324/765 X |

\* cited by examiner

*Primary Examiner*—N. Le
*Assistant Examiner*—T. R. Sundaram
(74) *Attorney, Agent, or Firm*—Laurence A. Greenberg; Werner H. Stemer; Ralph E. Locher

(57) ABSTRACT

In the method for testing a memory cell, a test voltage is applied to a memory cell and the test voltage is changed, preferably in incremental or decremental steps, during the testing. From the shape of the hysteresis of the memory cell it is determined whether or not the memory cell is a weak or substandard memory cell.

15 Claims, 1 Drawing Sheet

METHOD OF TESTING MEMORY CELLS WITH A HYSTERESIS CURVE

BACKGROUND OF THE INVENTION

Field of the Invention

The present invention relates to a method of testing memory cells with a hysteresis curve, in which test voltages are applied to the memory cell during a testing procedure.

Such memory cells with a hysteresis curve may be ferroelectric memory cells, magnetic memory cells, etc. The invention can generally be readily used for all memory cells of which the storage medium has hysteresis properties.

A ferroelectric memory cell contains a ferroelectric storage capacitor and a selection transistor, which is connected to a bit line and at a gate of which a word line is connected. The electrode of the storage capacitor that is not connected to the selection transistor is referred to as plate and is at a pulsed potential. If appropriate, the plate may also have a fixed voltage applied to it.

An information bit "0" or "1" is stored in the ferroelectric storage capacitor according to the state of polarization of the latter.

The memory cell is activated for example by applying a positive voltage pulse to the plate and raising the word line to a high voltage level. The selection transistor opens and the storage capacitor discharges its charge to the bit line. Depending on the information stored in the storage capacitor, the charge discharged to the bit line may have a greater or smaller value, so that a voltage level V1 or V0 occurs on the bit line.

For optimum sensing of this voltage level on the bit line BL, which represents a data signal signifying a logical "1" or "0", the voltage level is compared with a reference signal, which usually has the value (V1+V0)/2. The reference signal may be generated, for example, independently for each pair of bit lines by two memory cells which are respectively storing signals corresponding to a logical "0" or "1". This information bit of a "0" or "1" is delivered to a pair of reference bit lines, which are shorted and consequently supply the voltage (V1+V0)/2 to both bit lines. The reference voltage (V1+V0)/2 is obtained from the reference memory cells before an actual reading operation on a word line for a memory cell begins.

The storage of a "0" or "1" in the storage medium of the ferroelectric storage capacitor is based on the bistable behavior of the storage medium. For this purpose, the hysteresis curve of the ferroelectric storage capacitor, the polarization (in As) of the storage medium can be plotted as a function of the electric field strength (in V/m). By applying a suitable electric field (E) to the ferroelectric storage capacitor, two stable states "0" and "1" can be obtained after switching off the electric field E.

However, it must be noted at the same time that the hysteresis curve is not constant, but is subjected to an aging process ("aging"). The aging process depends on numerous factors, such as for example the number of reading/writing cycles executed with the ferroelectric storage capacitor, thermal and mechanical loads etc. The aging process has the effect that the hysteresis curve shrinks in its shape, which is referred to as relaxation, is shifted in the horizontal and/or vertical direction or is deformed horizontally/vertically. The last-mentioned aging effect is also referred to as "fatigue".

The position of the stable states "0" and "1" is thus influenced by "fatigue", i.e. the energy or charge recovered by reading the memory cell depends on "fatigue".

Consequently, two minimum levels for the polarization, which have to exist in any event in order for correct reading of the logical information "0" or "1" to be possible from the storage capacitor. If the hysteresis curve is deformed horizontally/vertically due to "aging" as a result of "fatigue" in such a way that it lies below the minimum levels, such memory cells can no longer be correctly evaluated.

It is consequently important to segregate weak or substandard memory cells which can no longer be evaluated from the remaining memory cells and replace them by memory cells which are operating normally, that is for which the hysteresis curve extends over the minimum levels. Such segregation also increases the production yield, since, before they are dispatched for delivery, memory cells are subjected to a "burn-in" test in order that weak memory cells due to exposure to high external temperatures, voltages etc. are in any event aged rapidly, whereby these weak memory cells, that is in particular those memory cells which exhibit excessive "aging", are identified. A repair of such weak memory cells is no longer possible at this late state of production, so that memories with weak memory cells must be discarded.

It is consequently of decisive importance to distinguish weak memory cells from normal memory cells as early as possible to allow them to be replaced by normal memory cells.

It is consequently the object of the present invention to specify a method of testing memory cells with a hysteresis curve which allows the most reliable possible detection of weak memory cells, that is in particular those memory cells which exhibit greater "aging" than usual, at an early time.

Summary of the Invention

It is accordingly an object of the invention to provide a method of testing memory cells with a hysteresis curve that overcomes the disadvantages of the prior art methods of this general type, in which test voltages are changed in steps during the testing procedure in order to sense memory cells with a deformed hysteresis curve.

With the foregoing and other objects in view there is provided, in accordance with the invention, a method of testing a memory. The method includes the steps of applying a test voltage to a memory cell during a testing procedure; changing the test voltage in steps during the testing procedure and determining if the memory cell has a deformed hysteresis curve.

In the case of the method according to the invention, consequently, as soon as the cell array of the ferroelectric memory is realized in a chip, the memory is subjected to a testing procedure, in which the test voltage applied to the individual memory cells is changed in steps. Consequently, weak memory cells can be determined and, if need be, can still be replaced by normal memory cells. A particularly significant aspect of the invention is the step-by-step or incremental (or decremental) changing of the internal voltage present at the memory cells in the chip, whereby weak cells can be established without using excessive testing time.

The test voltages may be applied in various ways: for example, it is possible to change the plate voltage present at the storage capacitor in steps. Similarly, a reference voltage, with which a reading voltage read out from the memory cell is compared, can be changed in steps. The voltage applied to a word line may also be changed in steps. Finally, it is also possible for a writing voltage applied to the memory cell to be changed in steps.

Other features which are considered as characteristic for the invention are set forth in the appended claims.

Although the invention is illustrated and described herein as embodied in a method of testing memory cells with a hysteresis curve, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 2:
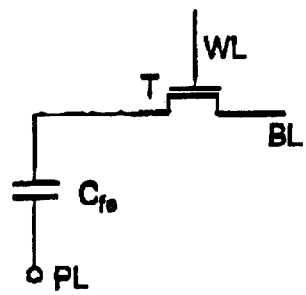
FIG. 2 is a schematic illustration of a memory cell.

In all the figures of the drawing, sub-features and integral parts that correspond to one another bear the same reference symbol in each case. Referring now to the figures of the drawing in detail and first, particularly, to FIG. 2 thereof, there is shown schematically the construction of a ferroelectric memory cell containing a ferroelectric storage capacitor $C_{fe}$ and a selection transistor T. The selection transistor T is connected to a bit line BL and at a gate of which a word line WL is connected. The electrode of the storage capacitor $C_{fe}$ that is not connected to the selection transistor T is referred to as plate PL and is at a pulsed potential. If appropriate, the plate PL may also have a fixed voltage applied to it.

An information bit "0" or "1" is stored in the ferroelectric storage capacitor Cfe according to the state of polarization of the latter.

The memory cell is activated for example by applying a positive voltage pulse to the plate PL and raising the word line WL to a high voltage level. The selection transistor T opens and the storage capacitor $C_{fe}$ discharges its charge to the bit line BL. Depending on the information stored in the storage capacitor $C_{fe}$, the charge discharged to the bit line BL may have a greater or smaller value, so that a voltage level V1 or V0 occurs on the bit line BL.

For optimum sensing of this voltage level on the bit line BL, which represents a data signal signifying a logical "1" or "0", the voltage level is compared with a reference signal, which usually has the value (V1+V0)/2. The reference signal may be generated, for example, independently for each pair of bit lines by two memory cells which are respectively storing signals corresponding to a logical "0" or "1". This information bit of a "0" or "1" is delivered to a pair of reference bit lines, which are shorted and consequently supply the voltage (V1+V0)/2 to both bit lines. The reference voltage (V1+V0)/2 is obtained from the reference memory cells before an actual reading operation on a word line for a memory cell begins.

Figure 3:
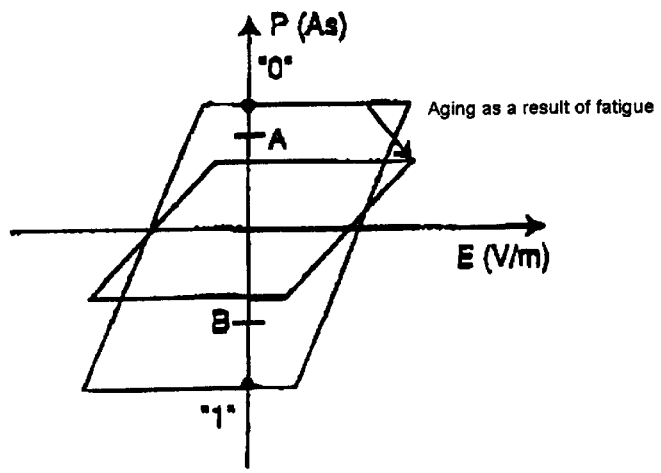
FIG. 3 is a graph of a hysteresis curve or loop of a ferroelectric storage capacitor.

The storage of a "0" or "1" in the storage medium of the ferroelectric storage capacitor $C_{fe}$ is based on the bistable behavior of the storage medium. For this purpose, FIG. 3 shows the hysteresis curve of the ferroelectric storage capacitor $C_{fe}$, the polarization P (in As) of the storage medium being plotted as a function of the electric field strength (in V/m). By applying a suitable electric field (E) to the ferroelectric storage capacitor $C_{fe}$, two stable states "0" and "1" can be obtained after switching off the electric field E.

However, it must be noted at the same time that the hysteresis curve is not constant, but is subjected to an aging process ("aging"). The aging process depends on numerous factors, such as for example the number of reading/writing cycles executed with the ferroelectric storage capacitor, thermal and mechanical loads etc. The aging process has the effect that the hysteresis curve shrinks in its shape, which is referred to as relaxation, is shifted in the horizontal and/or vertical direction or is deformed horizontally/vertically. The last-mentioned aging effect is also referred to as "fatigue" and is schematically indicated in FIG. 3.

The position of the stable states "0" and "1" is thus influenced by "fatigue", i.e. the energy or charge recovered by reading the memory cell depends on "fatigue".

Consequently, indicated in FIG. 3 are two minimum levels A and B for the polarization, which have to exist in any event in order for correct reading of the logical information "0" or "1" to be possible from the storage capacitor. If the hysteresis curve is deformed horizontally/vertically due to "aging" as a result of "fatigue" in such a way that it lies below the minimum levels A and B, as is indicated in FIG. 3, such memory cells can no longer be correctly evaluated.

It is consequently essential to segregate weak memory cells which can no longer be evaluated from the remaining memory cells and replace them by memory cells which are operating normally, that is for which the hysteresis curve extends over the minimum levels A and B. Such segregation also increases the production yield, since, before they are dispatched for delivery, memory cells are subjected to a "burn-in" test in order that weak memory cells due to exposure to high external temperatures, voltages etc. are in any event aged rapidly, whereby these weak memory cells, that is in particular those memory cells which exhibit excessive "aging", are identified. A repair of such weak memory cells is no longer possible at this late state of production, so that memories with weak memory cells must be discarded.

Figure 1:
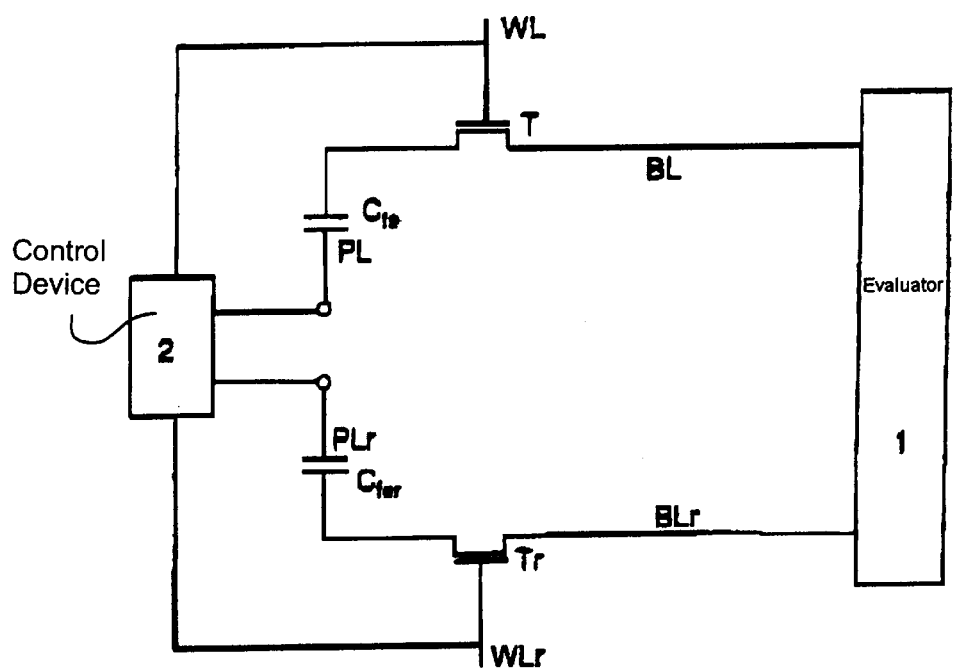
FIG. 1 is a schematic circuit diagram for explaining a method according to the invention.

FIG. 1 shows the ferroelectric memory cell with the ferroelectric storage capacitor $C_{fe}$ and the selection transistor T and also a reference cell with a ferroelectric reference storage capacitor $C_{fer}$ and a reference selection transistor Tr. The bit line BL and a reference bit line BLr are connected to an evaluator 1. The plate PL of the storage capacitor $C_{fe}$, a reference plate PLr of the reference storage capacitor $C_{fer}$, the word line WL and a reference word line WLr are also connected to a control device 2, with the aid of which the respective voltages at the plate PL, the reference plate PLr, the word line and the reference word line WLr can be changed.

When a ferroelectric memory with memory cells and reference memory cells has been completed, the method according to the invention can be used for example for reducing in steps, for example by a factor of 0.95 of a first-applied value, a plate voltage $V_{plate}$ present at the plate PL (or reference plate PLr) in a test. This procedure is carried out in steps by further reduction of the voltage $V_{plate}$, until a certain number of weak memory cells have been determined, which are then replaced by normal redundant memory cells.

In another test mode, the reference voltage which is obtained from the voltage levels V0 and V1 of two reference memory cells with a stored "0" and "1", respectively (only one reference memory cell is represented in FIG. 1 for simplicity), is changed in steps. Such a modification of the reference voltage likewise makes it possible to identify weak memory cells and replace them by normal, redundant memory cells. This test mode is equivalent to shifting the minimum levels A and B (see FIG. 3), since here the information bits read out, that is "0" or "1", are compared with a reference voltage changing in steps, so that the respective shape of the hysteresis curve is established for the memory cells. In this way, a relaxation of the hysteresis can be determined.

Furthermore, in another test mode, the voltage VPP present at the word line WL (or at the reference word line WLr) can be changed or reduced in steps. By such a reduction of the voltage VPP, voltage levels that are lower in steps are present at the ferroelectric storage capacitor $C_{fe}$ (or reference storage capacitor $C_{fer}$) during a writing operation. As a result, normal logical states "0" and "1" cannot be achieved, or only with lower energy, so that less charge is discharged to the bit lines BL (or reference bit lines BLr) during a later reading operation. By reducing the voltage VPP present at the word line WL (or reference word line WLr) in steps, those cells which are impaired by deformation of the hysteresis curve can then be established. This is because these cells will fail first in this reduction.

Finally, the voltage levels at the bit line BL (or reference bit line BLr) can be reduced in steps during reading operations. That is to say, the "0" or "1" levels of writing operations are reduced in steps between different test sequences. In the case of such an approach, deformed hysteresis curves are first to cross the critical polarization levels A and B, so that weak memory cells fail first and can be identified in this way as well.

I claim:

1. A method of testing a memory cell, which comprises the steps of:
   applying a test voltage to the memory cell during a testing procedure;
   changing the test voltage during the testing procedure; and
   determining if the memory cell has a hysteresis curve which is deformed beyond a certain parameter indicating a substandard memory cell.

2. The method according to claim 1, which comprises testing a ferroelectric memory cell.

3. The method according to claim 2, wherein the test voltage is a plate voltage present at a ferroelectric storage capacitor of the ferroelectric memory cell.

4. The method according to claim 1, wherein the test voltage is a reference voltage, with which a reading voltage read out from the memory cell is compared.

5. The method according to claim 1, wherein the test voltage is a voltage applied to a word line connected to the memory cell.

6. The method according to claim 1, wherein the test voltage is a writing voltage applied to the memory cell.

7. The method according to claim 1, which further comprises replacing the substandard memory cell by a normal redundant memory cell.

8. The method according to claim 1, wherein the step of changing the test voltage is performed in incremental or decremental steps.

9. A method of testing a memory having a plurality of memory cells, which comprises the steps of:
   (a) applying a test voltage to the plurality of memory cells during a testing procedure for identifying weak memory cells based on the hysteresis curve of the weak memory cells;
   (b) changing the test voltage by a factor;
   (c) repeating steps (a) and (b) until a number of weak memory cells is determined;
   (d) replacing the determined number of identified weak memory cells by normal redundant memory cells.

10. The method according to claim 9, which comprises testing a ferroelectric memory cell.

11. The method according to claim 10, wherein the test voltage is a plate voltage present at a ferroelectric storage capacitor of the ferroelectric memory cell.

12. The method according to claim 9, wherein the test voltage is a reference voltage, with which a reading voltage read out from the memory cell is compared.

13. The method according to claim 9, wherein the test voltage is a voltage applied to a word line connected to the memory cell.

14. The method according to claim 9, wherein the test voltage is a writing voltage applied to the memory cell.

15. The method according to claim 9, wherein the step of changing the test voltage is performed in incremental or decremental steps.

* * * * *